United States Patent [19]
Glatzel

[11] Patent Number: 4,559,978
[45] Date of Patent: Dec. 24, 1985

[54] CONNECTION WIRE ALIGNMENT OR ORIENTATION APPARATUS AND METHOD FOR ELECTRICAL CIRCUIT ELEMENTS

[75] Inventor: Werner Glatzel, Schellerten Ot Ottbergen, Fed. Rep. of Germany

[73] Assignee: Blaupunkt-Werke GmbH, Hildesheim, Fed. Rep. of Germany

[21] Appl. No.: 592,939

[22] Filed: Mar. 23, 1984

[30] Foreign Application Priority Data
Mar. 31, 1983 [DE] Fed. Rep. of Germany ....... 3311792

[51] Int. Cl.[4] ............................................. B21F 1/02
[52] U.S. Cl. ...................................... 140/147; 72/112
[58] Field of Search ................. 72/112, 125; 140/140, 140/147, 149; 29/564.1, 741

[56] References Cited
U.S. PATENT DOCUMENTS 2,861,620 11/1958 Paulson ................................. 72/112
3,580,297 5/1971 Spadoni .............................. 140/149
3,700,011 10/1972 Walter ................................. 140/149
3,742,987 7/1973 Tarbox et al. ...................... 140/147

FOREIGN PATENT DOCUMENTS
856783 12/1960 United Kingdom .

Primary Examiner—Francis S. Husar
Assistant Examiner—Robert Showalter
Attorney, Agent, or Firm—Frishauf, Holtz, Goodman & Woodward

[57] ABSTRACT

The projecting leads of electrical components can be automatically aligned by placing the component in a holder (12) with the leads (15) depending therefrom, sliding each lead into a tapered central groove (21) of a rotating alignment body (18), and withdrawing the lead once it has been re-oriented along a desired alignment axis (17). The holder (12) is reciprocated to and from the rotating bodies (18) along spring-loaded guide rods (13) riding in bores (10). A motor (5) drives the bodies (18) by means of pulleys (9, 19) and belts (20).

6 Claims, 8 Drawing Figures

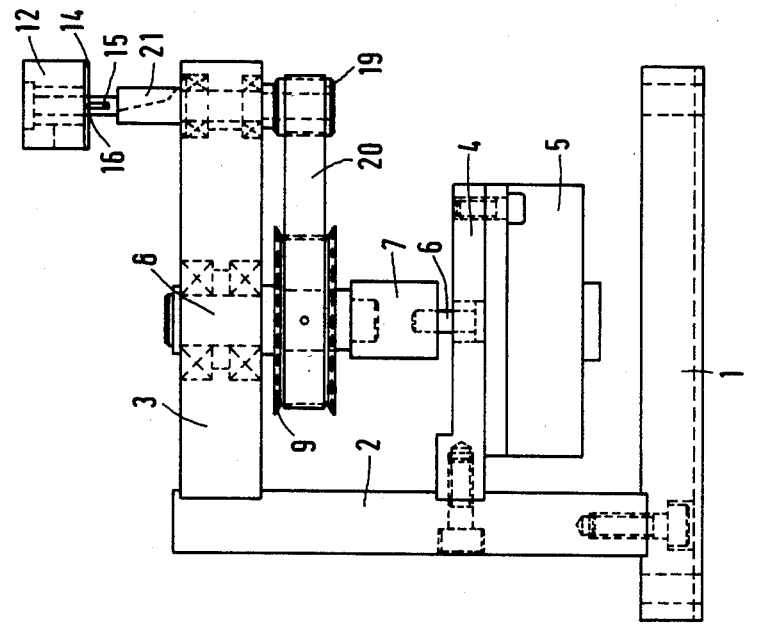
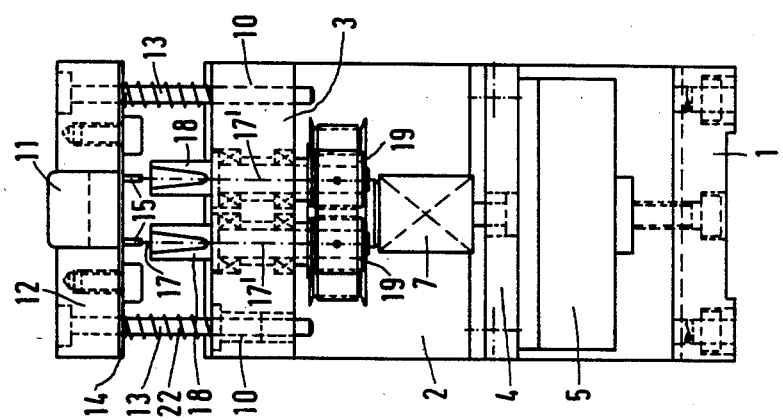

CONNECTION WIRE ALIGNMENT OR ORIENTATION APPARATUS AND METHOD FOR ELECTRICAL CIRCUIT ELEMENTS

The present invention relates to connection wire alignment or orientation apparatus provided for the insertion of electrical circuit elements, in particular printed circuits.

BACKGROUND

The parallel connection wires of conventional electrical circuit elements, when furnished to the consumer, do not have the close tolerances required for an automatic insertion of printed circuit boards (PCBs). In an automatic insertion, the connection wires of the circuit elements to be used are oriented in parallel and introduced from above, by means of a gripper, into the openings, or bores, of the circuit boards to be so equipped. In order to be certain of meeting the bores accurately, the gripper, which centers and firmly holds the connection wires, must be brought as close as possible to the bores. In the case of electrical circuit elements with relatively large and/or block-like dimensions, the connection wires cannot, if they are beyond a certain packing density, be introduced into the bores of the circuit board using a gripper. Circuit elements of this kind therefore necessitate a time-consuming insertion by hand.

THE INVENTION

It is accordingly the object of the invention to provide an apparatus and method with which the connection wires of conventional component elements intended for electrical circuits can be brought close to their desired position in such a manner that they enable unproblematic insertion into bores intended for them in a circuit board.

Briefly, a rotatable alignment body with an axial opening or groove engages around the projecting end of a component lead or wire. As the alignment body rotates, it bends any crooked lead into a straight orientation along its axis of rotation. To effect this engagement, the circuit element or component is brought toward the alignment body, or vice versa, and is withdrawn as the lead is straightened.

One possible configuration for the axial groove is a V-shaped cross-section, with the large-diameter end facing the approaching lead and facilitating the insertion of a lead which may originally be bent well out of the desired alignment axis. Due to the rotation of the alignment body, the lead is bent toward the central axis of rotation. The continuously decreasing radius of the opening allows less and less divergence from the desired axis as the lead penetrates farther and farther into the opening.

A separate alignment body can be arranged for each component lead, and driven by a common drive means, so that all the leads of a component can be aligned simultaneously. It is advantageous to support the alignment bodies in a horizontal bearing plate with their front (component-facing) ends projecting vertically upward, and to support the component in a holder above the alignment bodies with the leads projecting down through bores in a base plate, so that lowering the component holder causes the leads to engage the axial openings of the alignment bodies.

The advantages attained with the invention are derived particularly from the fact that the ends of the connection wires of electrical component elements for printed circuits can be positioned simply and quickly in their desired positions. As a result, the insertion of such components is simplified considerably. The apparatus is furthermore easily integrated into an automatic insertion apparatus.

DRAWINGS

FIG. 1 is a front view of a connection wire alignment or orientation apparatus for electrical components;

FIG. 2 is a side view of the same apparatus;

DESCRIPTION OF THE PREFERRED EMBODIMENT

Figure 3:
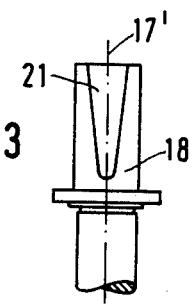
FIG. 3 is an enlarged side view of the top portion of an alignment body, seen from the grooved side.
Figure 4:
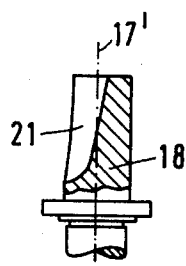
FIG. 4 is a side view, partially in section, of the alignment body of FIG. 3, rotated 90 degrees clockwise.
Figure 5:
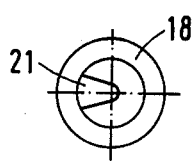
FIG. 5 is a top view of the alignment body of FIG. 4.

On a horizontally arranged, rectangular base plate 1 as shown in FIGS. 1 and 2, a vertically disposed, rectangular rear wall 2 is secured. At the upper end of the rear wall 2, a bearing plate 3 of square embodiment extending toward the front, beyond the base plate 1, and disposed parallel thereto, is secured. Between the base plate 1 and the bearing plate 3, a securing plate 4 for an electric motor 5 is provided, disposed parallel to the base plate 1. The drive shaft 6 of the electric motor 5 protrudes vertically upward through a bore of the securing plate 4. The drive shaft 6 of the motor 5 is provided via a coupling element 7 with a shaft 8 rotatably supported in the bearing plate 3 and disposed axially with respect to the drive shaft 6, and a pulley 9 is secured to the lower portion of the shaft 8. The forward section of the bearing plate 3 is provided with two vertically disposed through bores 10 that are embodied as slide bearings. A guide element or holder 12 provided for receiving an electrical circuit element 11 and extending over the width of the bearing plate is provided with guide rods 13 oriented vertically downward and supported in the through bores 10. The guide rods 13 serve as a means of parallel guidance and enable a vertical lowering of the holder 12 and thus of the electrical circuit element 11. The holder 12 is provided with a horizontally disposed base plate 14, which has bores 16 associated with the connection wires 15. The two connection wires 15 of the electrical circuit element 11 supported in a positively engaged manner in the holder 12 protrude vertically downward, being oriented through the bores 16 of the base plate 14 and on through. In an extension of the prespecified desired or alignment axis 17 of each connection wire 15, one alignment body 18 is provided, each being rotatably supported in the bearing plate 3 about the alignment axis 17, which corresponds to the axis of rotation 17' of the alignment body 18. The ends of the alignment bodies 18 that protrude out from the bearing plate 3 at the bottom are each provided with pulleys 19, which are operatively connected with the pulleys 9 via transmission belts 20. The ends of the alignment bodies 18 that protrude out from the bearing plate 3 at the top are cylindrical in embodiment. They are provided, as shown in FIGS. 3-5, with a groove 21 disposed in the plane of the axis of rotation 17'. This groove 21 is inclined with respect to the axis of rotation 17' and its depth extends, at the top or front end of the alignment body 18, across the axis of rotation 17' therefore; with increasing distance from the front end, toward the outside, the depth decreases. The groove 21 has a V-shaped cross section that becomes wider toward the outside, and beginning at the front end, its course is increasingly curved as it proceeds toward the outside.

Figure 6:
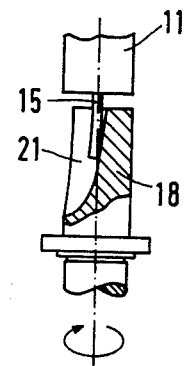
FIG. 6 shows the body of FIG. 4 with a wire inserted.
Figure 7:
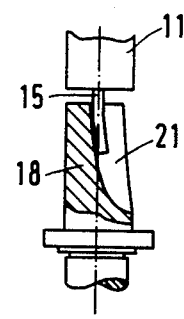
FIG. 7 shows the result of rotating the body ½ turn.
Figure 8:
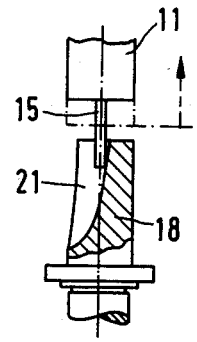
FIG. 8 shows the component and straightened wire being withdrawn.

For orienting or aligning the connection wires 15, the electrical circuit element 11 is lowered vertically, together with the holder 12, by the external application of force. The ends of the connection wires 15 are thereby engaged by the grooves 21 of the rotating alignment bodies 18 and picked up. With a connection wire 15 that is predominantly inserted into the groove 21, the end of the connection wire 15 becomes bent, because of the oblique course of the groove 21 as shown in FIGS. 6 and 7, revolvingly and centrally about its desired position. The end of the wire thereby executes a tumbling or wobbling movement. By means of a subsequent vertical raising of the holder 12 and an associated retraction of the connection wire 15 out of the groove 21, the effective radius of this tumbling movement decreases continuously, until the connection wire 15 has attained its prespecified desired position shown in FIG. 8.

In the embodiment according to FIGS. 1 and 2, the circuit element 11 is lowered together with the holder 12 counter to the spring force of helical springs 22 disposed on the guide rods 13; these helical springs 22 then return the holder 12 to its position of rest.

A controlled gripping arm of an automatic insertion apparatus may also be used as the holder.

The time required for aligning the connection wires 15 depends on the rotational speed of the alignment bodies. A speed of n=3000 revolutions per minute has proved to be particularly advantageous.

I claim:

1. An automatic alignment apparatus for straightening a projecting lead (15) of an electrical component (11), comprising
    a base plate (1), vertical wall (2), and bearing plate (3) secured in fixed relationship to one another;
    means (12) supported by said bearing plate (3) for holding said component in fixed relationship to said apparatus, with the component's leads projecting,
    at least one rotatable alignment body (18) supported by said bearing plate (3), said body (18) having an axis of rotation (17'), a longitudinal outer surface and a front end disposed proximately to said component, and an axial inner groove (21);
    said alignment body (18) being supported in said apparatus along a desired alignment axis (17) of one said lead,
    means (10,13,22) supported by said bearing plate (3) for reciprocating one of said component (11) and said alignment body (18), toward and away from the other, to cause said lead (15) to penetrate and engage said axial groove (21) of said alignment body, and
    means (5,6,7,19,20) movably secured to said bearing plate (3) for rotating said alignment body while said lead is engaged therewithin;
    wherein said axial groove of said alignment body is defined by an inner surface of said body, which surface diverges, at least at said front end, from said axis of rotation (17') and crosses said axis of rotation (17') and curves at an increasing angle to said axis of rotation (17') at increasing distances from said component-proximate end.

2. The apparatus of claim 1, wherein said inner surface has the cross-sectional shape, in its major transverse dimension, of a parabola, whose central axis is radially offset from said axis (17') of rotation.

3. The apparatus of claim 1, wherein (FIG. 1) a plurality of rotatable alignment bodies (18) are provided, said bodies being disposed axially parallel, and common drive means (9,19,20) rotate said bodies.

4. A method of bending a connection wire (15) from an electrical circuit element (11) into a desired alignment axis (17), comprising the steps of:
    inserting the wire (15) into a rotating alignment body (18) having a component-proximate end and which is rotatable about an axis (17') corresponding to the desired alignment axis (17) of the connecting wire, said body (18) having an axial groove defined by an inner surface of said body which crosses said axis of rotation and curves at an increasing angle to said alignment axis at increasing distances from said component-proximate end, said surface also having a wall portion essentially in alignment with said desired axis (17); and
    relatively axially moving the circuit element, and with it said connection wire (15), relative to said body (18), while said body is rotating, and as said wire (15) is withdrawn from said body, said inner surface bends the wire (15) from an initially misaligned position, to assume a position adjacent the rotating wall portion, of the body, which is in alignment with the desired axis (17).

5. Method according to claim 4, wherein said wall portion converges toward said desired axis from an initially remote position.

6. Method according to claim 5, wherein said wall portion converges essentialy conically.

* * * * *